United States Patent
Lin et al.

(10) Patent No.: US 9,064,880 B2
(45) Date of Patent: Jun. 23, 2015

(54) ZERO STAND-OFF BONDING SYSTEM AND METHOD

(71) Applicant: Taiwan Semiconductor Manufacturing Company, Ltd., Hsin-Chu (TW)

(72) Inventors: Chun-Hung Lin, Taipei (TW); Ming-Che Ho, Tainan (TW); Yu-Feng Chen, Hsin-Chu (TW); Yi-Wen Wu, Xizhi (TW); Hsien-Liang Meng, Hsin-Chu (TW); Han-Ping Pu, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 115 days.

(21) Appl. No.: 13/762,754

(22) Filed: Feb. 8, 2013

(65) Prior Publication Data

US 2014/0183746 A1    Jul. 3, 2014

Related U.S. Application Data (60) Provisional application No. 61/747,008, filed on Dec. 28, 2012.

(51) Int. Cl.
| | |
|---|---|
| H01L 21/44 | (2006.01) |
| H01L 21/48 | (2006.01) |
| H01L 23/00 | (2006.01) |
| H01L 23/31 | (2006.01) |
| H01L 25/10 | (2006.01) |

(52) U.S. Cl.
CPC .............. *H01L 23/562* (2013.01); *H01L 24/81* (2013.01); *H01L 2224/16225* (2013.01); *H01L 2224/32225* (2013.01); *H01L 2224/73204* (2013.01); *H01L 2224/83192* (2013.01); *H01L 24/29* (2013.01); *H01L 24/83* (2013.01); *H01L 2224/2919* (2013.01); *H01L 2224/81193* (2013.01); *H01L 2224/81815* (2013.01); *H01L 23/3128* (2013.01); *H01L 23/3171* (2013.01); *H01L 25/105* (2013.01)

(58) Field of Classification Search
USPC ........... 438/118, 613, 108, 106; 257/E23.023
See application file for complete search history.

(56) References Cited

U.S. PATENT DOCUMENTS

| | | | | |
|---|---|---|---|---|
| 6,583,364 | B1 * | 6/2003 | Kurita et al. ................... | 174/254 |
| 6,643,923 | B1 * | 11/2003 | Hishinuma et al. ............. | 29/846 |
| 7,011,988 | B2 * | 3/2006 | Forcier .......................... | 438/108 |
| 8,345,435 | B2 * | 1/2013 | Hamatani et al. .............. | 361/762 |
| 2002/0053735 | A1 * | 5/2002 | Neuhaus et al. ............... | 257/728 |
| 2004/0012080 | A1 * | 1/2004 | Hedler et al. .................. | 257/678 |
| 2008/0242005 | A1 * | 10/2008 | Dozen et al. ................... | 438/127 |
| 2011/0215464 | A1 * | 9/2011 | Guzek et al. ................... | 257/737 |

* cited by examiner

*Primary Examiner* — Nitin Parekh
(74) *Attorney, Agent, or Firm* — Slater & Matsil, L.L.P.

(57) ABSTRACT

A system and method for a zero stand-off configuration are provided. An embodiment comprises forming a seal layer over a conductive region that is part of a first substrate and breaching the seal with a conductive member of a second substrate in order to bond the first substrate to the second substrate.

20 Claims, 6 Drawing Sheets

ZERO STAND-OFF BONDING SYSTEM AND METHOD

This application claims the benefit of U.S. Provisional Application Ser. No. 61/747,008, filed on Dec. 28, 2012, entitled "Zero Stand-Off Bonding System and Method," which application is hereby incorporated herein by reference.

BACKGROUND

Generally, a semiconductor device such as a semiconductor die may be connected to other devices such as other semiconductor dies or, alternatively, may be connected to external devices using, for example, a package. The connection to other devices may be performed in a variety of means to both physically and electrically connect the semiconductor device to other devices. Some types of connection technology include flip chip, solder balls, wired connections, or through silicon vias.

When a package is utilized, the package can provide an element of protection and support for the semiconductor device while also serving as an intermediary between the semiconductor device and devices external to the semiconductor device. The semiconductor device may be electrically and physically connected to the package through a variety of means to transfer signals, power, and ground between the package and the semiconductor device, with the package providing, for example, routing fan-out and other functions to receive and provide signals to the semiconductor device.

In a package-on-package configuration, a first semiconductor device, such as a first semiconductor die may be connected to a first package to support and protect the first semiconductor device. A second semiconductor device, such as a second die may be connected to a second package in order to protect the second semiconductor device. The first package may then be bonded to the second package in order to physically and electrically connect the first semiconductor device to the second semiconductor device so that the first semiconductor device may work either in conjunction with or concurrently with the second semiconductor device.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a semiconductor die bonded to a package in a zero stand-off configuration. Other embodiments may also be applied, however, to other bonding configurations.

Figure 1:
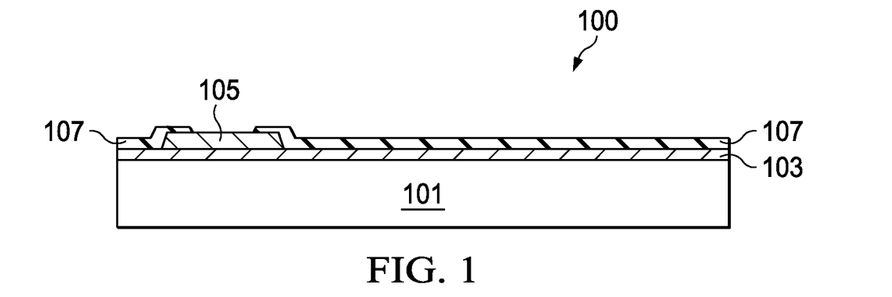
FIG. 1 illustrates a semiconductor device in accordance with an embodiment.

With reference now to FIG. 1, there is shown a portion of a semiconductor die 100 including a semiconductor substrate 101 with metallization layers 103, a contact pad 105, and a first passivation layer 107. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices (not shown) may be formed on the semiconductor substrate 101. As one of ordinary skill in the art will recognize, a wide variety of active devices such as capacitors, resistors, inductors and the like may be used to generate the desired structural and functional requirements of the design for the semiconductor die 100. The active devices may be formed using any suitable methods either within or else on the surface of the semiconductor substrate 101.

The metallization layers 103 are formed over the semiconductor substrate 101 and the active devices and are designed to connect the various active devices to form functional circuitry. While illustrated in FIG. 1 as a single layer, the metallization layers 103 may be formed of alternating layers of dielectric (e.g., low-k dielectric material) and conductive material (e.g., copper) and may be formed through any suitable process (such as deposition, damascene, dual damascene, etc.). In an embodiment there may be four layers of metallization separated from the semiconductor substrate 101 by at least one interlayer dielectric layer (ILD), but the precise number of metallization layers 103 is dependent upon the design of the semiconductor die 100.

The contact pad 105 may be formed over and in electrical contact with the metallization layers 103. The contact pad 105 may comprise aluminum, but other materials, such as copper, may alternatively be used. The contact pad 105 may be formed using a deposition process, such as sputtering, to form a layer of material (not shown) and portions of the layer of material may then be removed through a suitable process (such as photolithographic masking and etching) to form the contact pad 105. However, any other suitable process may be utilized to form the contact pad 105. The contact pad 105 may be formed to have a thickness of between about 0.5 μm and about 4 μm, such as about 1.45 μm.

The first passivation layer 107 may be formed on the semiconductor substrate 101 over the metallization layers 103 and the contact pad 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any suitable process may be utilized, and may have a thickness between about 0.5 μm and about 5 μm, such as about 9.25 KÅ.

Figure 2A:
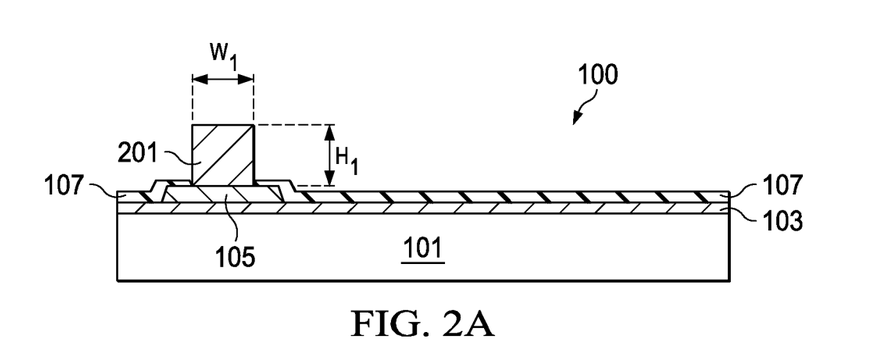
FIGS. 2a and 2b illustrate an underbump metallization on the semiconductor device in accordance with an embodiment.

After the first passivation layer 107 has been formed, an opening may be made through the first passivation layer 107 by removing portions of the first passivation layer 107 to expose at least a portion of the underlying contact pad 105. The opening allows for contact between the contact pad 105 and an underbump metallization (UBM) 201 (not illustrated in FIG. 1 but illustrated and discussed below with respect to FIG. 2). The opening may be formed using a suitable photolithographic masking and etching process, although any suitable process to expose portions of the contact pad 105 may be used.

Figure 2B:
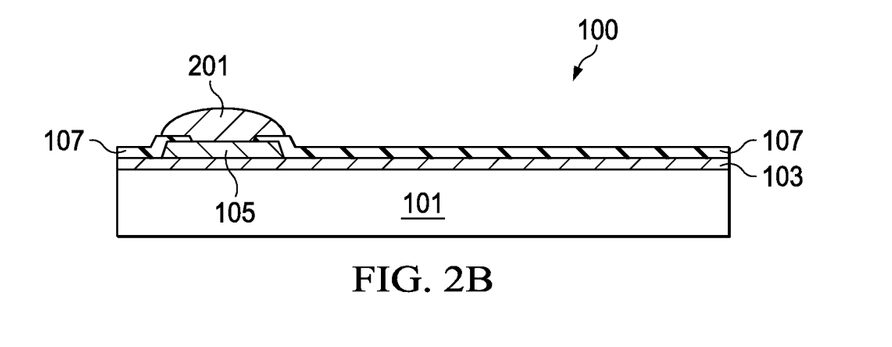

FIG. 2 illustrates that, once the contact pad 105 has been exposed through the first passivation layer 107, the UBM 201 may be formed in electrical contact with the contact pad 105. In an embodiment the UBM 201 may comprise copper or nickel, although any suitable material or combination of materials may alternatively be utilized. For example, in an alternative embodiment the UBM 201 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 201. Any suitable materials or layers of material that may be used for the UBM 201 are fully intended to be included within the scope of the current application.

The UBM 201 may be created by forming a layer of material over the contact pad 105. The forming of each layer may be performed using a plating process, such as electroless plating, although other processes of formation, such as sputtering, evaporation, or PECVD process, may alternatively be used depending upon the desired materials. By using electroless plating, the UBM 201 will selectively be formed on the contact pad 105 and will not be formed over non-conductive regions, such as the first passivation layer 107. As such, the UBM 201 will be formed to extend away from the contact pad 105 through the first passivation layer 107 and extend away from the substrate 101. In an embodiment the UBM 201 may have a first height $H_1$ of between about 10 μm and about 100 μm, such as about 15 μm, and a first width $W_1$ of between about 5 μm and about 100 μm, such as about 30 μm.

Figure 3:
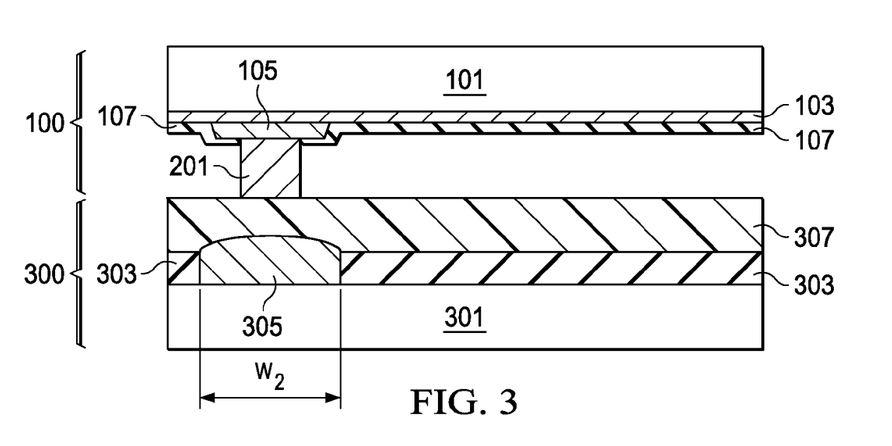
FIG. 3 illustrates an alignment of the semiconductor device and a second substrate in accordance with an embodiment.

FIG. 3 illustrates an alignment of the semiconductor die 100 to a second device 105 for bonding in a zero stand-off flip chip package configuration. In an embodiment in which the second device 300 is a semiconductor device, the second device 300 may comprise a second substrate 301 of semiconductor material to form a second semiconductor die with active devices, metallization layers, and external contacts formed on the second substrate 301. In another embodiment in which the second device 300 is a package substrate, the second substrate 301 may be a packaging substrate comprising internal interconnects to connect the semiconductor die 100 to other external devices (not illustrated in FIG. 3).

In yet another embodiment, the second device 300 may be an interposer used as an intermediate substrate to connect the first semiconductor device 100 to other external devices (not illustrated in FIG. 3). In such an embodiment the second substrate 301 may be, e.g., a silicon substrate, doped or undoped, or an active layer of a silicon-on-insulator (SOI) substrate. However, the second substrate 301 may alternatively be a glass substrate, a ceramic substrate, a polymer substrate, or any other substrate that may provide a suitable protection and/or interconnection functionality. These and any other suitable materials may alternatively be used for the second substrate 301 in the second device 300.

Over the second substrate 301 a connection mask 303 may be formed in order to assist in the manufacturing and placement of a first external connection 305 onto the second substrate 301. In an embodiment the connection mask 303 may be a solder mask used to mask portions of the second substrate 301 during the formation of the first external connection 305, and may be, e.g., a dielectric material such as silicon oxide formed using a CVD process and then patterned using, e.g., a photolithographic masking and etching process to expose an electrical connection.

However, as one of ordinary skill in the art will recognize, the depositing and patterning of a dielectric material is merely on embodiment that may be utilized to form the connection mask 303. Alternatively, the connection mask 303 may comprise a liquid epoxy applied using a silkscreen; a liquid photoimagable solder mask that is applied, exposed, and developed; or a dry film photoimagable solder mask that is laminated, exposed, and developed. These and any other suitable materials may be applied and patterned to form the connection mask 303, and all such materials and processes are fully intended to be included within the scope of the embodiments.

The first external connection 305 may be formed to provide an external connection between the second substrate 301 and the UBM 201. The first external connection 305 may be, e.g. a layer of solder and may comprise a material such as tin or other suitable materials, such as silver or copper. In an embodiment in which the first external connection 305 is a tin solder material, the first external connection 305 may be formed by initially forming a layer of tin into the openings of the connection mask 303 through any suitable method such as evaporation, electroplating, printing, solder transfer, etc, to a preferred thickness of about 30 μm. In an embodiment the first external connection 305 may be formed to have a second width $W_2$ of between about 20 μm and about 300 μm, such as about 75 μm.

After the first external connection 305 has been formed, a seal layer 307 is formed over the connection mask 303 and the first external connection 305. In an embodiment the seal layer 307 is utilized to tie together the semiconductor device 100 and the second device 300 such that there is no gap and a zero stand-off between the semiconductor device 100 and the second substrate 301. In an embodiment the seal layer 307 is formed of a seal material such as an epoxy flux or non-conductive film that will protect as well as provide support for both the semiconductor device 100 and the second device 300. In an embodiment in which the seal layer 307 is epoxy, the seal layer 307 may be formed using a process such as CVD, printing, taping, or liquid spinning. The seal layer 307 may be formed to a thickness of between about 10 μm and about 50 μm, such as about 15 μm.

After the seal layer 307 has been formed over the connection mask 303 and the first external connection 305, the semiconductor device 100 and the second substrate 301 may be aligned with each other such that the UBM 201 is directly over the first external connection 305, with the seal layer 307 in between the UBM 201 and the first external connection 305. This placement may be manual or automated, and may be performed with the aid of alignment marks (not individually illustrated in FIG. 3) or other suitable methods of aligning the semiconductor device 100 with the second device 300.

Figure 4:
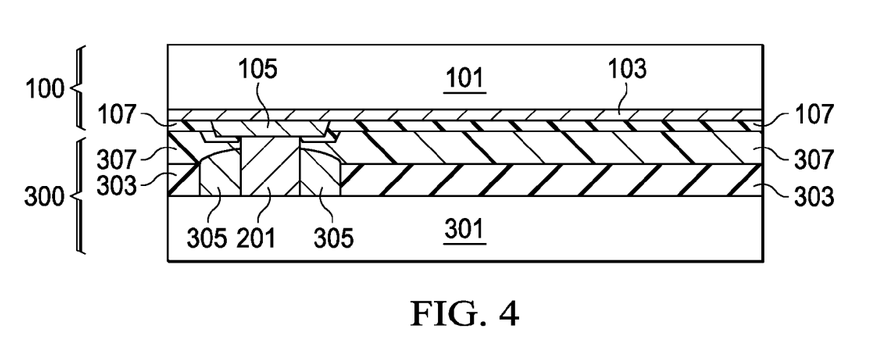
FIG. 4 illustrates a bonding of the semiconductor device and the second substrate in a zero stand-off configuration in accordance with an embodiment.

FIG. 4 illustrates that after the semiconductor device 100 has been aligned with the second device 300, the semiconductor device 100 may be bonded to the second device 300 in a zero stand-off configuration. In an embodiment the bonding may be performed by initially heating the semiconductor device 100 and the second device 300 (along with their individual structures such as the mask 307 and the first external connection 305) to a temperature greater than the melting point of the seal layer 307. In an embodiment in which the seal layer 307 is epoxy, the semiconductor device 100 and the seal layer 307 may be raised to a temperature greater than about 150° C., such as about 220° C. Optionally, the semiconductor device 100 and the second device 300 may have their temperature raised to temperature greater than the melting point of the first external connection 305 in order to perform a reflow of the first external connection 305.

Alternatively, instead of raising the temperature of both the semiconductor die 100 and the second device 300, heat may be selectively applied to the seal layer 307 and, optionally, the first external connection 305. The selective application of heat may be utilized to soften or liquefy the seal layer 307 and/or the first external connection 305 without necessitating the heating of the remainder of the structures. As such, unnecessary heating and undesired physical results (e.g., thermal expansion mismatches and undesired material diffusion) may be minimized.

By raising the temperature of the seal layer 307 greater than the melting point of the seal layer 307, the seal layer 307 will soften or liquefy. Once the seal layer 307 has been softened or liquefied, the UBM 201 may be pushed through the seal layer 307 to make contact with the first external connection 305. In an embodiment the UBM 201 may be pushed through the seal layer 307 by applying a pressure to either the semiconductor device 100 or the second substrate 301, or both. Any suitable pressure may alternatively be utilized.

With the seal layer 307 softened or liquefied and pressure being applied, the UBM 201 will extend through the seal layer 307 and come into physical and electrical contact with the first external connection 305 of the second device 300. Additionally, in an embodiment in which the first external connection 305 has been heated to a temperature greater than its melting point, the UBM 201 will also extend into the first external connection 305, thereby making contact with the first external connection 305 on multiple sides and sidewalls of the UBM 201. Once the UBM 201 has extended through the seal layer 307 and made contact with the first external connection 305, the temperature of the semiconductor device 100 and the second device 300 may be reduced below the melting point of the seal layer 307 and the first external connection 305, thereby solidifying the seal layer 307 and the first external connection 305 and bonding the semiconductor device 100 to the second device 300.

Alternatively, the semiconductor device 100 and the second device 300 may be bonded together using a thermal-compression bonding (TCB) technique. In such a technique the semiconductor device 100 and the fourth substrate 730 may be heated to a temperature greater than about 150° C., such as about 220° C.

In an embodiment, while the UBM 201 is being pushed through the seal layer 307 and making contact with the first external connection 305, the first passivation layer 107 is making physical contact with the seal layer 307. By making physical contact between the first passivation layer 107 and the seal layer 307, there is no gap between the semiconductor device 100 and the second substrate 301, allowing for the zero stand-off configuration.

With this configuration, the semiconductor device 100 is in contact with the seal layer 307 along the length of the seal layer 307, and both the semiconductor device 100 and the second substrate 301 provide support for the connection between the UBM 201 and the first external connection 305. With greater support, there will be less joint failure and less warpage around the connection, leading to an overall greater efficiency and yield during a production process. Additionally, with zero stand-off, the overall structure may be made smaller and thinner, leading to an overall reduction in the size of the device.

Figure 5:
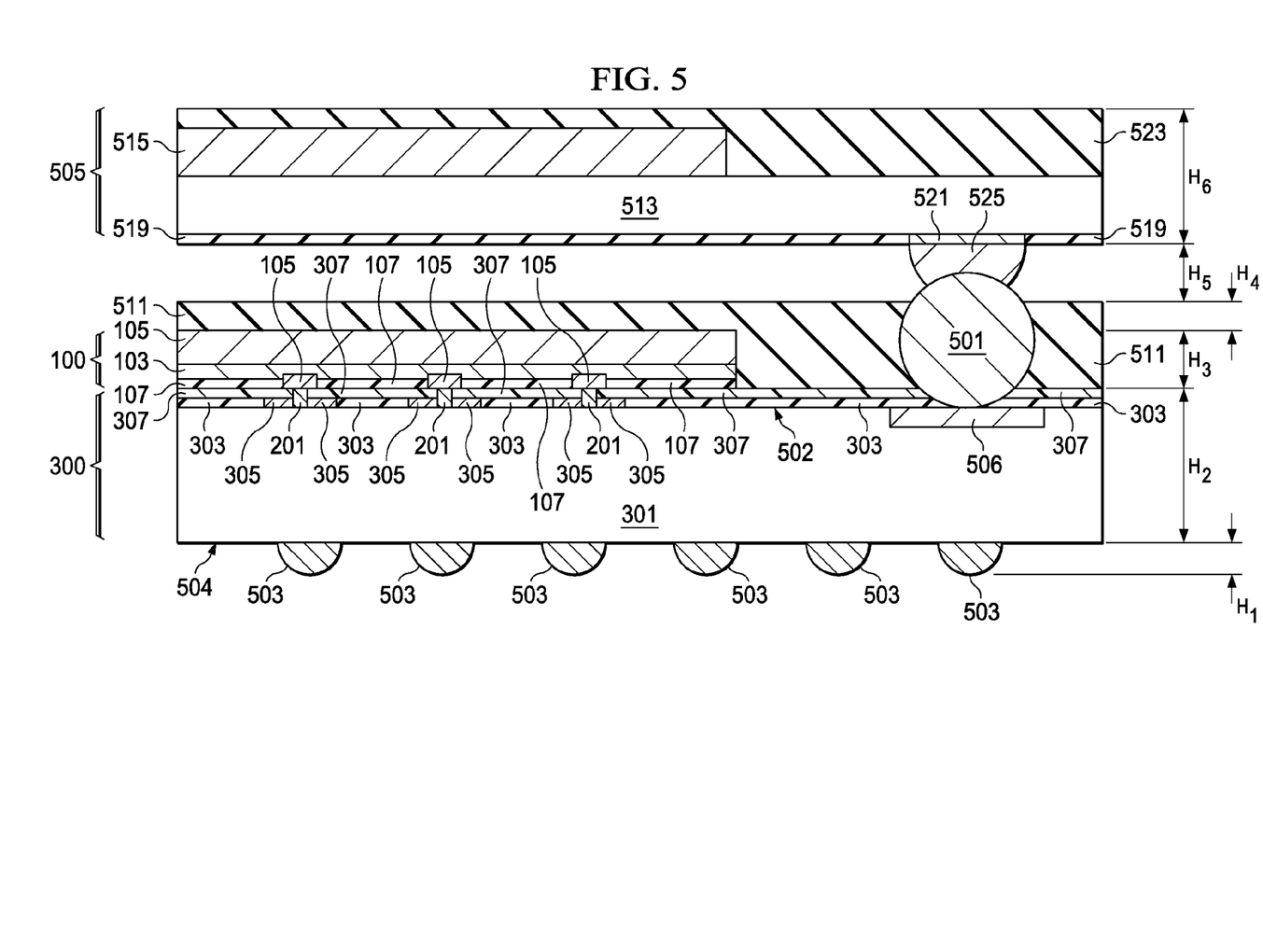
FIG. 5 illustrates a zero stand-off configuration in a package on package configuration in accordance with an embodiment.

FIG. 5 illustrates another embodiment in which the semiconductor device 100 and the second device 300 have been utilized in a package on package (PoP) configuration. In this embodiment, additional processing has been performed on the second substrate 301 to include both a second external connection 501 on a first side 502 of the second substrate and to include third external connections 503 on a second side 504 of the second substrate 301. In an embodiment the third external connections 503 may be formed to provide external connection between the second substrate 301 and external devices (not individually illustrated in FIG. 5). The third external connections 503 may be contact bumps such as microbumps or controlled collapse chip connection (C4) bumps and may comprise a material such as tin, or other suitable materials, such as silver or copper. In an embodiment in which the third external connections 503 are tin solder bumps, the third external connections 503 may be formed by initially forming a layer of tin through any suitable method such as evaporation, electroplating, printing, solder transfer, ball placement, etc, to a preferred thickness of about 100 μm. Once a layer of tin has been formed on the structure, a reflow is preferably performed in order to shape the material into the desired bump shape.

On the first side 502 of the second substrate 301, a second external connection 501 may be formed to provide electrical connectivity between a second contact pad 506 on the second substrate 301 and a second package 505. In an embodiment the second contact pad 506 may be, e.g., a similar material and formed from similar processes as the first contact pad 105 described above with respect to FIG. 1. However, the second contact pad 506 may alternatively be a different material and formed using different processes than the first contact pad 105. Any suitable electrical connection may alternatively be utilized for the second contact pad 506.

In an embodiment the second external connection 501 may be a copper bump to provide connection between the second substrate 301 and the second package 505. The copper bump may be formed of copper and may be placed on the second contact pad 506 using, e.g., an automated placement tool. Alternatively, the second external connection 501 may be a solder bump formed by placing a layer of solder material onto the second contact pad 506 and then reflowed to form the desired bump shape. Any suitable material and method may alternatively be used to provide an electrical connection to the first side 502 of the second substrate 301.

Once the second external connection 501 has been placed or otherwise formed, an encapsulant 511 may be placed over the semiconductor device 100 and the second device 300 in order to provide support and protection to the semiconductor device 100 and the second device 300. In an embodiment the encapsulant 511 may be a molding compound and may be placed using a molding device. For example, the semiconductor device 100 and the second device 300 may be placed within a cavity of the molding device, and the cavity may be hermetically sealed. The encapsulant 511 may be placed within the cavity either before the cavity is hermetically sealed or else may be injected into the cavity through an injection port. In an embodiment the encapsulant 511 may be a molding compound resin such as polyimide, PPS, PEEK, PES, a heat resistant crystal resin, combinations of these, or the like.

Once the encapsulant 511 has been placed into the cavity such that the encapsulant 511 encapsulates the region around the semiconductor device 100 and the second device 300, the encapsulant 511 may be cured in order to harden the encapsulant 511 for optimum protection. While the exact curing process is dependent at least in part on the particular material chosen for the encapsulant 511, in an embodiment in which molding compound is chosen as the encapsulant 511, the curing could occur through a process such as heating the encapsulant 511 to between about 100° C. and about 130° C., such as about 125° C. for about 60 sec to about 3000 sec, such as about 600 sec. Additionally, initiators and/or catalysts may be included within the encapsulant 511 to better control the curing process.

However, as one having ordinary skill in the art will recognize, the curing process described above is merely an exemplary process and is not meant to limit the current embodiments. Other curing processes, such as irradiation or even allowing the encapsulant 511 to harden at ambient temperature, may alternatively be used. Any suitable curing process may be used, and all such processes are fully intended to be included within the scope of the embodiments discussed herein.

The second package 505 may comprise a third substrate 513, a second semiconductor device 515, a second passivation layer 519, a third contact pad 521, a second encapsulant 523, and a fourth external connection 525. In an embodiment the third substrate 513 may be similar to the second substrate 301 described above with respect to FIG. 3. For example, the third substrate 301 may be a semiconductor, glass, or ceramic substrate, and may be either a package or an interposer type of substrate. However, the third substrate 513 may alternatively be different from the second substrate 301.

The second semiconductor device 515 may be similar to the first semiconductor device 100 described above with respect to FIG. 1. For example, the second semiconductor device 515 may be a semiconductor device with a semiconductor substrate, active devices, and metallization layers (not individually illustrated in FIG. 5) that is designed and manufactured to work in conjunction with or concurrently with the semiconductor device 100 through the second device 300. However, the second semiconductor device 515 may alternatively be different from the semiconductor device 100, and any suitable device may alternatively be utilized.

The second passivation layer 519 may be formed to protect the third substrate 513 and may be, e.g., a similar material formed by a similar process as the first passivation layer 107. For example, the second passivation layer 519 may be dielectric material formed using chemical vapor deposition. However, the second passivation layer 519 may be different from the first passivation layer 107, and all suitable materials and methods of formation are fully intended to be included within the scope of the embodiments.

The third contact pad 521 may be formed on the third substrate 513 to form an electrical connection between the second semiconductor device 515 and, e.g., the second external connection 501. In an embodiment the third contact pad 521 may be a similar material and formed from similar processes as the first contact pad 105 described above with respect to FIG. 1, such as an aluminum contact pad. However, the third contact pad 521 may alternatively be a different material and formed using different processes than the first contact pad 105. Any suitable electrical connection may alternatively be utilized for the third contact pad 521.

The second encapsulant 523 may be used to encapsulate and protect the second semiconductor device 515 and the third substrate 513. In an embodiment the second encapsulant 523 may comprise similar materials and may be applied in a similar fashion as the first encapsulant 511. For example, the second encapsulant 523 may be a molding compound applied to the second semiconductor device 515 and the third substrate 513 using a molding chamber. However, the second encapsulant 523 may be different from the first encapsulant 511 and all such materials are fully intended to be included in the scope of the embodiments.

In an embodiment the fourth external connection 525 may be formed to provide an external connection between the third substrate 513 and the second external connection 501. The fourth external connection 525 may be a contact bump such as a microbump or a controlled collapse chip connection (C4) bump and may comprise a material such as tin, or other suitable materials, such as silver or copper. In an embodiment in which the fourth external connection 525 is a tin solder bump, the fourth external connection 525 may be formed by initially forming a layer of tin through any suitable method such as evaporation, electroplating, printing, solder transfer, ball placement, etc, to a preferred thickness of about 100 μm. Once a layer of tin has been formed on the structure, a reflow is preferably performed in order to shape the material into the desired bump shape.

Once formed, the fourth external connection 525 is aligned with the second external connection 503 and the second substrate 301 may be bonded to the second package 505 by placing the fourth external connection 525 in contact with the second external connection 503. Once in place, a reflow process is performed, such as by heating the fourth external connection 525 and applying a pressure such that the fourth external connection 525 and the second external connection 503 physically bond with each other and form a physical and electrical bond.

Figure 6:
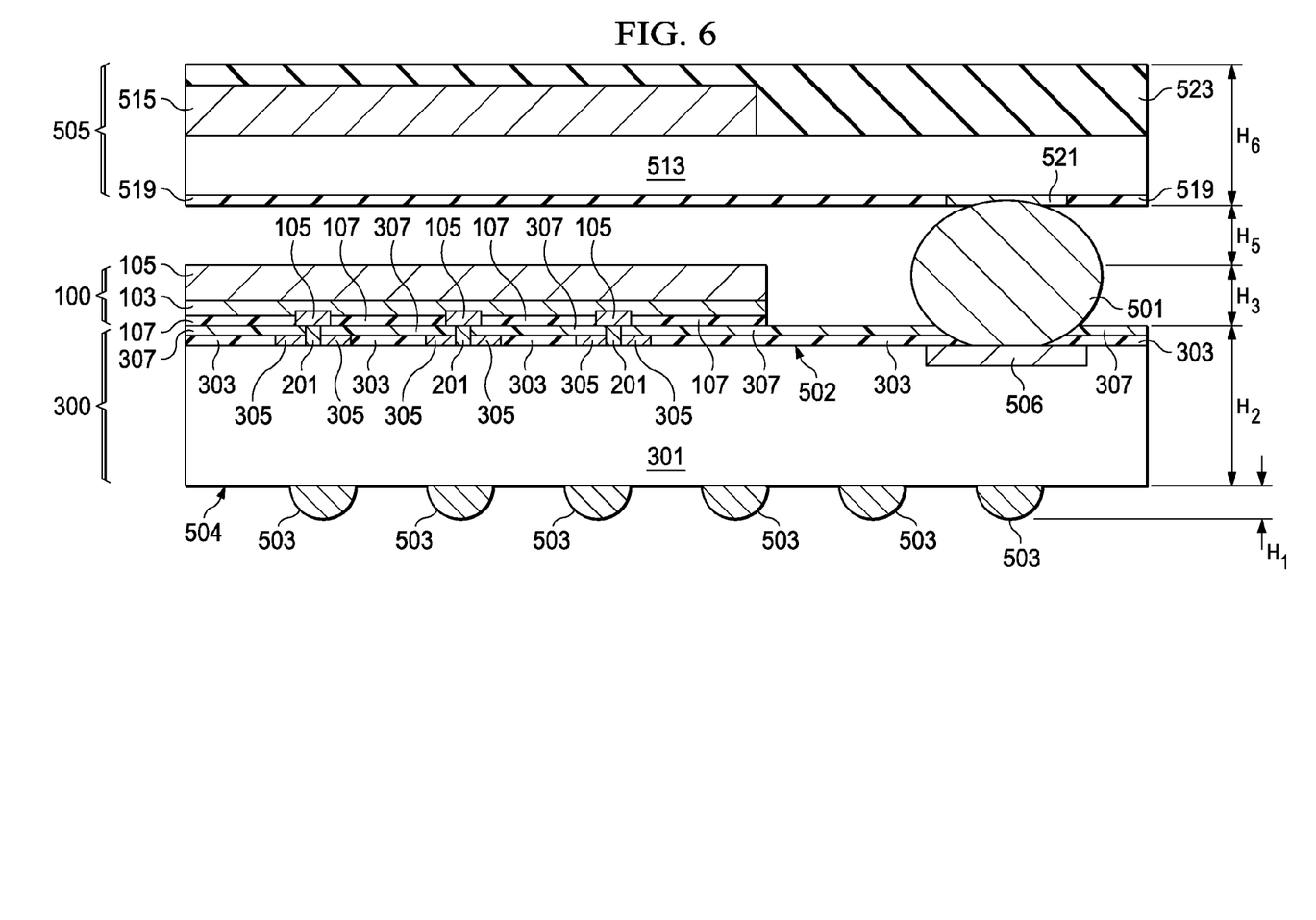
FIG. 6 illustrates a zero stand-off configuration in a package on package configuration without a molding compound in accordance with an embodiment.

FIG. 6 illustrates another embodiment in which a zero stand-off configuration may be utilized. In this configuration, the first encapsulant 511 is not utilized and the second external connection 501, instead of being a copper ball, is a solder ball. By foregoing the first encapsulant 511 and using a solder ball instead of a copper ball, the zero stand-off package-on-package configuration may be manufactured for a cheaper amount than the more expensive copper ball and encapsulation process described above.

Figure 7A:
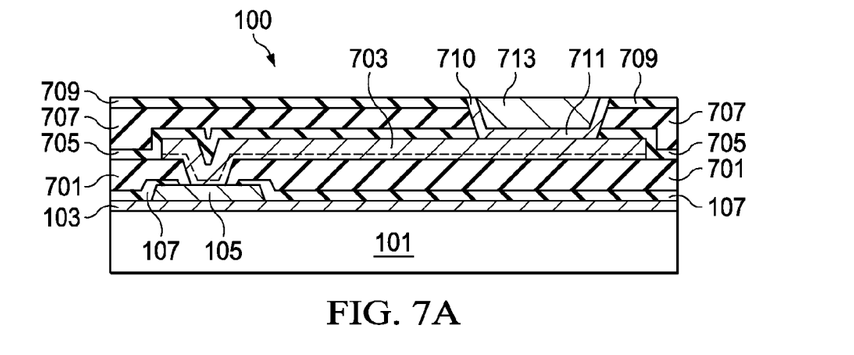
FIGS. 7A-7E illustrate an alternative method of forming an underbump metallization in accordance with an embodiment.

FIGS. 7A-7E illustrate another embodiment which may be used in order to form the UBM 201 for use in a wafer level chip scale packaging (WLCSP) configuration. In this embodiment the substrate 101, the metallization layers 103, the first contact pad 105, and the first passivation layer 107 may all be formed as described above with respect to FIG. 1. However, in this embodiment, and as shown in FIG. 7A, a third passivation layer 701, a post passivation interconnect (PPI) 703, a fourth passivation layer 705, a fifth passivation layer 707, a sixth passivation layer 709, a seed layer 711, and a first UBM section 713 may be formed over the first contact pad 105. In an embodiment the third passivation layer 701 may be formed over the contact pad 105 and the first passivation layer 107. The third passivation layer 701 may be formed from a polymer such as polyimide. Alternatively, the third passivation layer 701 may be formed of a material similar to the material used as the first passivation layer 107, such as silicon oxides, silicon nitrides, low-k dielectrics, extremely low-k dielectrics, combinations of these, and the like. The third passivation layer 701 may be formed to have a thickness between about 2 μm and about 15 μm, such as about 5 μm.

After the third passivation layer 701 has been formed, an opening may be made through the third passivation layer 701 by removing portions of the third passivation layer 701 to expose at least a portion of the underlying contact pad 105. The opening allows for contact between the contact pad 105 and the PPI 703 (discussed further below). The opening may be formed using a suitable photolithographic mask and etching process, although any suitable process to expose portions of the contact pad 105 may be used.

After the contact pad 105 has been exposed, the PPI 703 may be formed to extend along the third passivation layer 701. The PPI 703 may be utilized as a redistribution layer to allow the first UBM section 713 that is electrically connected to the contact pad 105 to be placed in any desired location on the semiconductor device 100, instead of limiting the location of the first UBM section 713 to the region directly over the contact pad 105. In an embodiment the PPI 703 may be formed by initially forming a seed layer (shown with a dashed line in FIG. 7A) of a titanium copper alloy through a suitable formation process such as CVD or sputtering. A photoresist (not shown) may then be formed to cover the seed layer, and the photoresist may then be patterned to expose those portions of the seed layer that are located where the PPI 703 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm, and a width along the substrate 101 of between about 5 μm and about 300 μm, such as about 15 μm. However, while the material and methods discussed are suitable to form the conductive material, these materials are merely exemplary. Any other suitable materials, such as AlCu or Au, and any other suitable processes of formation, such as CVD or PVD, may alternatively be used to form the PPI 703.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

Once the PPI 703 has been formed, the fourth passivation layer 705, the fifth passivation layer 707, and the sixth passivation layer 709 may be formed to collectively protect the PPI 703 and the other underlying structures. The fourth passivation layer 705, the fifth passivation layer 707, and the sixth passivation layer 709 may each be formed of a dielectric material, such as polyimide, silicon oxide, silicon nitride, a low-k dielectric, an extremely low-k dielectric, combinations of these, and the like, and may be formed or applied to the PPI 703 using a suitable manufacturing process depending upon the material desired for each layer. For example, in an embodiment in which the fifth passivation layer 707 is polyimide and the sixth passivation layer 709 is silicon nitride, the fifth passivation layer 707 may be applied using a spin-on process, while the sixth passivation layer 709 may be formed using a CVD process. Any suitable materials and methods of formation, and any suitable combination of materials and methods of formation, may be utilized to form the fourth passivation layer 705, the fifth passivation layer 707, and the sixth passivation layer 709, and all such materials and methods are fully intended to be included within the scope of the embodiments.

After the fourth passivation layer 705, the fifth passivation layer 707, and the sixth passivation layer 709 have been formed, a PPI opening 710 may be made through the fourth passivation layer 705, the fifth passivation layer 707, and the sixth passivation layer 709 by removing portions of the fourth passivation layer 705, the fifth passivation layer 707, and the sixth passivation layer 709 to expose at least a portion of the underlying PPI 703. The PPI opening 710 allows for contact between the first UBM section 713 and the PPI 703. The PPI opening 710 may be formed using a suitable photolithographic mask and etching process, although any suitable process to expose portions of the PPI 703 may alternatively be used.

Once the PPI 703 has been exposed through the fourth passivation layer 705, the fifth passivation layer 707, and the sixth passivation layer 709, the first UBM section 713 may be formed in electrical contact with the PPI 703. The first UBM section 713 may comprise one or more layers of conductive materials, such as copper or nickel, or a combination of layers, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the first UBM section 713. Any suitable materials or layers of material that may be used for the first UBM section 713 are fully intended to be included within the scope of the current application.

The first UBM section 713 may be created by first forming a seed layer 711 over the fourth passivation layer 705, the fifth passivation layer 707, and the sixth passivation layer 709, and along the interior of the PPI opening 710. Subsequent material for the first UBM section 713 may be formed using a plating process, such as electrochemical plating, although other processes of formation, such as sputtering, evaporation, or PECVD process, may alternatively be used depending upon the desired materials. The first UBM section 713 may be formed to have a thickness that fills and overfills the PPI opening 710. Once the desired layers have been formed, portions of the seed layer 711 and material outside of the PPI opening 710 may then be removed using a suitable planarization process, such as a chemical mechanical polish (CMP).

Figure 7B:
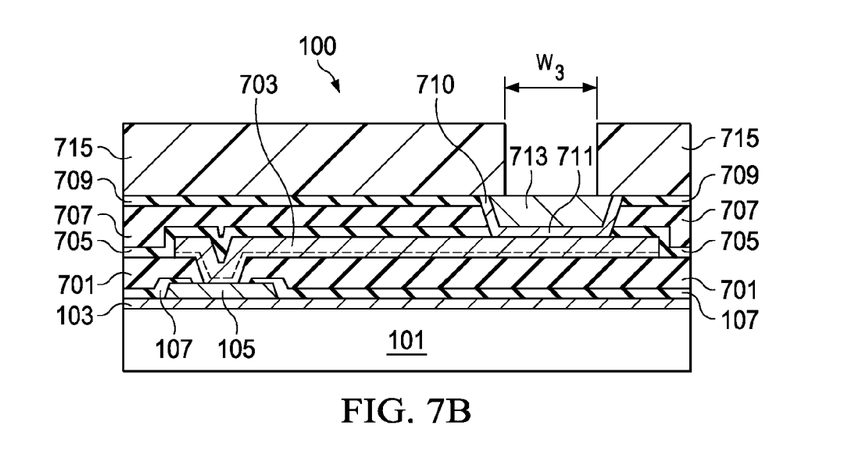

FIG. 7B illustrates a formation and patterning of a first photoresist 715 over the first UBM section 713. In an embodiment the first photoresist 715 may comprise a conventional photoresist material, such as a deep ultra-violet (DUV) photoresist, and may be deposited on the surface of the first UBM section 713, for example, by using a spin-on process to place the first photoresist 715. However, any other suitable material or method of forming or placing the first photoresist 715 may alternatively be utilized.

Once the first photoresist 715 has been placed on the first UBM section 713, the first photoresist 715 may be exposed to energy, e.g. light, through a patterned reticle in order to induce a reaction in those portions of the first photoresist 715 exposed to the energy. The first photoresist 715 may then be developed, and portions of the first photoresist 715 may be removed, exposing a surface of the first UBM section 713 to form a second UBM section 717 (not illustrated in FIG. 7B but illustrated and discussed below with respect to FIG. 7C). In an embodiment the development of the first photoresist 715 may form an opening with a third width $W_3$ of between about 5 μm and about 100 μm, such as about 30 μm.

Figure 7C:
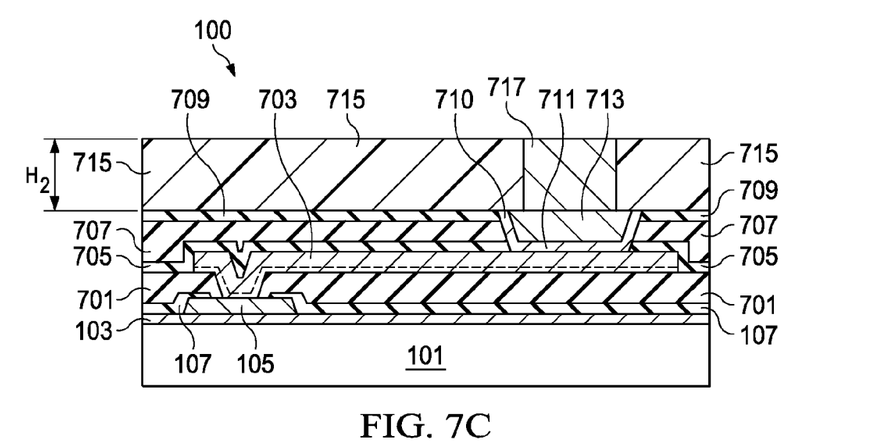

FIG. 7C illustrates a formation of the second UBM section 717 within the opening of the first photoresist 715 and physically and electrically connected to the first UBM section 713. In an embodiment the second UBM section 717 may comprise similar materials as the first UBM section 713 and may be made using similar processes. For example, the second UBM section 717 may be nickel or copper formed using an electroless plating process to fill and overfill the opening through the first photoresist 715. Once the opening through the first photoresist 715 has been overfilled, a planarization process (e.g., CMP) may be used to remove excess material outside of the opening to form the second UBM section 717. In an embodiment the second UBM section 717 may have a second height $H_2$ of between about 10 μm and about 100 μm, such as about 15 μm.

Figure 7D:
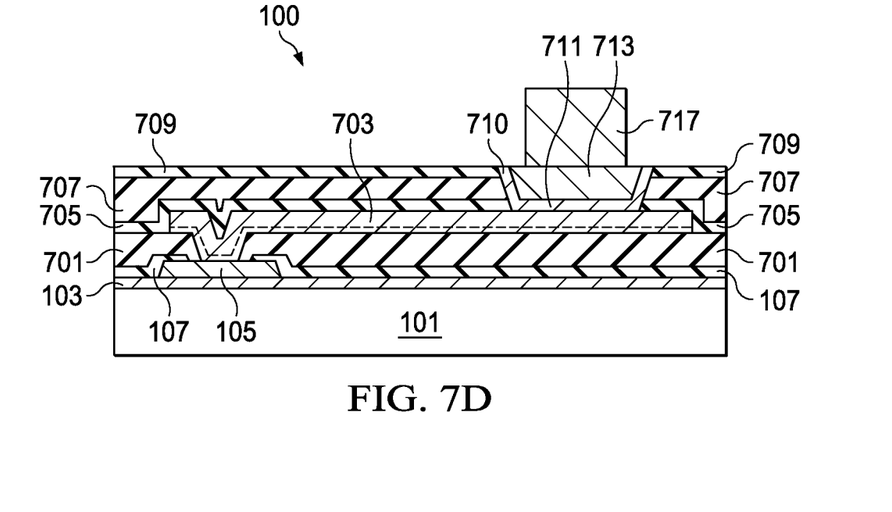

FIG. 7D illustrates a removal of the first photoresist 715. In an embodiment the first photoresist 715 may be removed using an ashing process, whereby the temperature of the first photoresist 715 is increased until it chemically degrades and may be removed. However, any other suitable removal process, such as etching or dissolving the first photoresist 715, may alternatively be utilized.

Figure 7E:
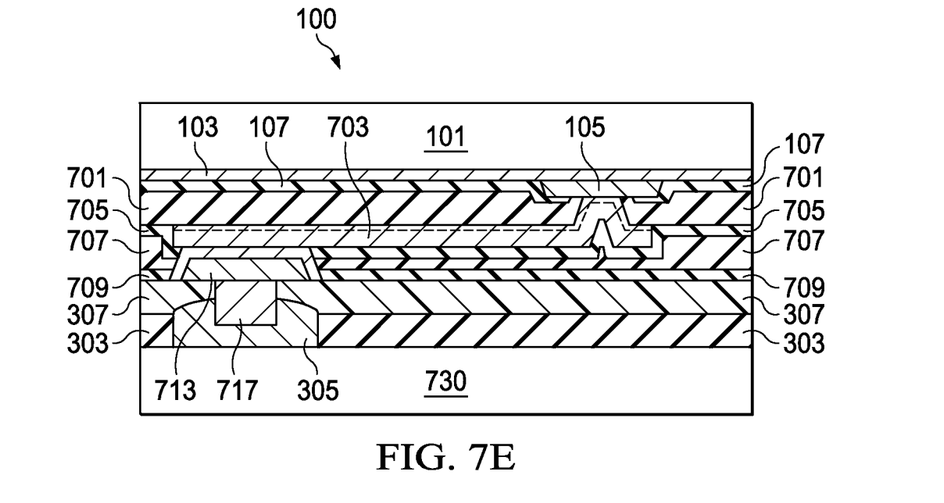

FIG. 7E illustrates the use of the first UBM section 713 and the second UBM section 717 in a zero stand-off wafer level chip scale packaging configuration to connect the semiconductor device 100 to a third device 729. In an embodiment the third device 729 may comprise a fourth substrate 730, which may be a third semiconductor substrate to form a third semiconductor die with active devices, metallization layers, and external contacts formed on the third semiconductor substrate.

Alternatively, the fourth substrate 730 may comprise an interposer used as an intermediate substrate to connect the first semiconductor device 100 to other external devices (not illustrated in FIG. 7E). In such an embodiment the fourth substrate 730 may be, e.g., a silicon substrate, doped or undoped, or an active layer of a silicon-on-insulator (SOI) substrate. However, the fourth substrate 730 may alternatively be a glass substrate, a ceramic substrate, a polymer substrate, or any other substrate that may provide a suitable protection and/or interconnection functionality. These and any other suitable materials may alternatively be used for the fourth substrate 730.

Over the fourth substrate 730 the connection mask 303, the first external connection 305 and the seal layer 307 may be formed. Once the connection mask 303, the first external connection 205 and the seal layer 307 have been formed, the semiconductor device 100 may be bonded to the fourth substrate 730 in a zero stand-off configuration by placing the second UBM section 717 in contact with the seal layer 307 over the first external connection 305. Once in place, the seal layer 307 is heated to a temperature greater than its melting point and pressure is applied. With the seal softened or liquefied, the second UBM section 717 breaches the seal layer 307 and comes into contact with the first external connection 305, thereby bonding the semiconductor device 100 to the fourth substrate 730.

Additionally, while the second UBM section 717 is extending through the seal layer 307 and making contact with the first external connection 305, the sixth passivation layer 709 is making physical contact with the seal layer 307. By making physical contact between the sixth passivation layer 709 and the seal layer 307, there is no gap between the semiconductor device 100 and the fourth substrate 730, allowing for the zero stand-off configuration. With this configuration, both the semiconductor device 100 and the fourth substrate 730 provide support for the connection between the second UBM section 717 and the first external connection 305. With greater support, there will be less joint failure and less warpage around the connection, leading to an overall greater efficiency and yield during a production process. Additionally, with zero stand-off, the overall structure may be made smaller and thinner, leading to an overall reduction in the size of the device.

In accordance with an embodiment, a method for bonding a semiconductor device comprising forming a seal over an electrical region of a first substrate is provided. A second substrate is bonded to the first substrate by breaching the seal with a conductive extension extending away from the second substrate.

In accordance with another embodiment, a method for bonding a semiconductor device comprising forming a seal on a first substrate, the seal overlying a conductive region, and heating the seal to a temperature greater than its melting point is provided. The seal is breached with a conductive member such that the conductive member is in physical contact with the conductive region, the conductive member being electrically connected to a second substrate, and the seal is cooled to a temperature below its melting point to bond the first substrate to the conductive member in a zero stand-off configuration.

In accordance with yet another embodiment, a semiconductor device comprising a first substrate with a first UBM extending away from the first substrate is provided. A second substrate is bonded to the first substrate, the second substrate comprising a seal, the first UBM extending through the seal to make contact with a conductive region of the second substrate, the seal in physical contact with the first substrate along the length of the seal.

Although the present embodiments and their advantages have been described in detail, it should be understood that various changes, substitutions and alterations can be made herein without departing from the spirit and scope of the disclosure as defined by the appended claims. For example, the precise materials utilized for the seal layer may be modified while still remaining within the scope of the embodiments. Further, the precise methods of formation and bonding described herein may also be modified while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for bonding a semiconductor device, the method comprising:
    forming a seal over an electrical region of a first substrate;
    increasing a temperature of the seal past its melting point;
    bonding a second substrate to the first substrate by breaching the seal with a conductive extension extending away from the second substrate; and
    cooling the seal after the bonding the second substrate to the first substrate to reduce the temperature of the seal below its melting point.

2. The method of claim 1, wherein the conductive extension is an underbump metallization.

3. The method of claim 2, further comprising forming the underbump metallization at least in part using electroless plating.

4. The method of claim 3, wherein the forming the underbump metallization further comprises:
forming a contact pad;
forming a passivation layer over the contact pad;
patterning the passivation layer to form an opening at least partially exposing the contact pad; and
selectively plating the underbump metallization onto the contact pad using the passivation layer as a mask.

5. The method of claim 1, wherein a semiconductor die having the second substrate is in physical contact with the seal along the length of the seal.

6. The method of claim 3, wherein the forming the underbump metallization further comprises:
forming a first underbump metallization section planar with a dielectric layer;
patterning a photoresist over the first underbump metallization section; and
plating a second underbump metallization section onto the first underbump metallization section.

7. The method of claim 1, wherein the second substrate is a package substrate.

8. A method for bonding a semiconductor device, the method comprising:
forming a seal on a first substrate, the seal overlying a conductive region;
heating the seal to a temperature greater than its melting point;
breaching the seal with a conductive member such that the conductive member is in physical contact with the conductive region, the conductive member being electrically connected to a second substrate; and
cooling the seal to a temperature below its melting point to bond the first substrate to the conductive member in a zero stand-off configuration.

9. The method of claim 8, wherein the conductive region is solder.

10. The method of claim 8, wherein the heating the seal further comprises heating the conductive region to a temperature higher than its melting point.

11. The method of claim 8, further comprising applying pressure after the heating the seal.

12. The method of claim 8, wherein the first substrate is a package and the second substrate is a semiconductor die.

13. The method of claim 12, further comprising bonding the package to a third substrate using a first external connection.

14. The method of claim 13, wherein the first external connection is a copper ball.

15. A method of bonding a semiconductor device, the method comprising:
placing a reflowable material over a conductive connection on a first substrate;
forming a seal layer over the reflowable material;
selectively applying heat to the seal layer and the reflowable material to reflow the reflowable material at a first temperature; and
physically pushing a first external connection of a second substrate through the seal layer while the seal layer is at the first temperature, wherein the first external connection makes electrical contact with the reflowable material and a top surface of the seal layer is in physical contact with the second substrate.

16. The method of claim 15, wherein the reflowable material is solder.

17. The method of claim 15, wherein the first temperature softens the seal layer.

18. The method of claim 15, wherein the first substrate is a package and the second substrate is a semiconductor die.

19. The method of claim 15, further comprising bonding the first substrate to a third substrate using a first external connection.

20. The method of claim 19, wherein the first external connection comprises copper.

* * * * *